United States Patent
Farrar

(10) Patent No.: US 7,094,682 B1
(45) Date of Patent: Aug. 22, 2006

(54) COATING OF COPPER AND SILVER AIR BRIDGE STRUCTURES TO IMPROVE ELECTROMIGRATION RESISTANCE AND OTHER APPLICATIONS

(75) Inventor: Paul A. Farrar, Okatie, SC (US)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 10/920,092

(22) Filed: Aug. 17, 2004

Related U.S. Application Data

(62) Division of application No. 10/291,909, filed on Nov. 8, 2002.

(51) Int. Cl.
*H01L 21/4763* (2006.01)

(52) U.S. Cl. .................. 438/619; 438/421; 438/422

(58) Field of Classification Search ............... 438/619, 438/421, 422; 257/522
See application file for complete search history.

(56) References Cited

U.S. PATENT DOCUMENTS

| | | | | |
|---|---|---|---|---|
| 4,933,743 | A | * | 6/1990 | Thomas et al. ............. 257/742 |
| 5,034,799 | A | | 7/1991 | Tomita et al. |
| 5,148,260 | A | | 9/1992 | Inoue et al. |
| 5,593,926 | A | | 1/1997 | Fujihira |
| 5,798,559 | A | * | 8/1998 | Bothra et al. ............... 257/522 |
| 5,994,777 | A | | 11/1999 | Farrar |
| 6,077,792 | A | | 6/2000 | Farrar |
| 6,097,092 | A | | 8/2000 | Natzle |
| 6,184,053 | B1 | | 2/2001 | Eldridge et al. |
| 6,294,455 | B1 | | 9/2001 | Ahn |
| 6,433,431 | B1 | | 8/2002 | Farrar |
| 6,800,912 | B1 | | 10/2004 | Ozgur |

OTHER PUBLICATIONS

Ferdinand L. Singer, " Strength of Materials," Harper & Brothers·1951, pp. 129, 230, 429.

"Properties and Selection: Nonferrous Alloys and Pure Metals," Metals Handbook, Ninth Edition, vol. 2, ASM International, pp. 727, 730, 732, 737, 738, 794, 795.

"Metallography, Structures and Phase Diagrams," Metals Handbook, Eighth Edition, vol. 8, ASM International, pp. 256, 302.

"Surface Cleaning, Finishing and Coating," Metals Handbook, Ninth Edition, vol. 5, ASM International, pp. 621-622.

Packaging, Electronic Materials Handbook, vol. 1, ASM International, p. 789.

(Continued)

*Primary Examiner*—Phat X. Cao
*Assistant Examiner*—Theresa T. Doan
(74) *Attorney, Agent, or Firm*—Knobbe Martens Olson & Bear, LLP

(57) ABSTRACT

An improved electrical interconnect for an integrated circuit and methods for providing the same are disclosed. The electrical interconnect includes an air bridge extending through a gaseous medium so as to reduce the capacitance of the interconnect. The air bridge is supported at a first and second end such that the air bridge is suspended above the substrate. The air bridge comprises a highly conductive material, such as silver, so as to provide the air bridge with a reduced resistivity. To inhibit gaseous medium from contaminating the air bridge, the air bridge further comprises an adherent coating interposed between the air bridge and the gaseous medium. A method of forming the electrical interconnect is also disclosed, wherein, prior to forming the adherent coating, the conductive material is processed so as to form fewer grain boundaries, which enhances the electrical properties of the air bridge.

24 Claims, 11 Drawing Sheets

OTHER PUBLICATIONS

P.A. Farrar, " Coating of Copper and Silver Air Bridge Structures," Micron Disclosure 99-1179.

Paul S. Ho, "Materials Issues and Recent Development of Low K Dielectrics for Advanced Interconnects," 48 AVS International Symposium, San Francisco, CA; Oct. 28-Nov. 2, 2001.

S.M. Rossnagel, "Conductivity Issues with Cu at sub 100nm Dimensions," 48 AVS International Symposium, San Francisco, CA; Oct. 28-Nov. 2, 2001.

* cited by examiner

COATING OF COPPER AND SILVER AIR BRIDGE STRUCTURES TO IMPROVE ELECTROMIGRATION RESISTANCE AND OTHER APPLICATIONS

RELATED APPLICATIONS

This Application is a divisional application of U.S. patent application Ser. No. 10/291,909 filed Nov. 8, 2002 entitled "COATING OF COPPER AND SILVER AIR BRIDGE STRUCTURES TO IMPROVE ELECTROMIGRATION RESISTANCE AND OTHER APPLICATIONS", which is hereby incorporated by reference in its entirety.

BACKGROUND OF THE INVENTION

1. Field of the Invention

The present invention relates to integrated circuits and, in particular, relates to miniaturized electrical interconnects having reduced resistance and capacitance.

2. Description of the Related Art

To provide improved performance, manufacturers of integrated circuit devices continually strive to increase circuit density. Such devices are typically formed on a semiconductor substrate, such as a silicon wafer, and comprise a large number of miniaturized circuit elements. These elements, which include transistors, diodes, capacitors, and resistors, are usually disposed within or adjacent the substrate and define a plurality of circuit nodes. To combine the circuit elements into a useful electronic circuit, integrated circuit devices typically include a plurality of conducting paths that link the circuit nodes in a preferred manner. Typically, the conducting paths are provided by electrical interconnects comprising metallic wires including, for example, wires made of aluminum or aluminum alloy that are embedded in an insulating layer such as a layer of insulating $SiO_2$.

However, as circuit density is increased, problems associated with conventional electrical interconnects are becoming more apparent. In particular, a higher density device having an increased number of circuit elements will likely require an even greater increase in the number of electrical interconnects. Consequently, the electrical interconnects will need to have a reduced thickness and adjacent interconnects will need to be spaced more closely together.

Unfortunately, such dimensional reductions tend to increase the resistance of individual interconnects and increase the capacitance between adjacent interconnects, thereby possibly increasing signal propagation delays and signal cross-talk. In particular, electrically charged adjacent conductors acts as the plates of the capacitors. As the distance between adjacent conductors decrease, the resulting capacitance increases. This resulting increase in capacitance slows propagation of signals as the capacitance must be overcome prior to propagation of the signal along the conductor. Hence, while it is desirable to increase device density on integrated circuits, considerations such as these pose problems for maintaining or improving circuit performance.

To improve the conductivity of interconnects, it has been suggested that copper metallurgy be substituted for the aluminum metallurgy that is now typically being used. Advantageously, copper metallurgy interconnects are viewed as having increased conductivity and thus less resistance. The lower resistance of interconnects of this metallurgy could allow the use of smaller dimensions of interconnects thereby facilitating the increase of device density on the integrated circuit. However, several potential problems have been encountered in the development of this proposed metallurgy. One of the main ones being the fast diffusion of copper through both silicon and $SiO_2$. Fast diffusion of copper into silicon or silicon oxide results in diffusion of the conductive interconnect into the surrounding materials which can damage device performance or can result in short circuits occurring between adjacent interconnects.

To decrease capacitive loading, it has been suggested that the interconnects could be embedded in a solid insulating medium other than $SiO_2$, such as a polymer comprising fluorinated polymide. However, as in the case of $SiO_2$, an incompatibility problem with copper metallurgy has been found. In the case of polyimide, and many other polymers, it has been found that the polymer, during the curing, reacts with copper forming a conductive oxide $CuO_2$, which is dispersed within the polymer. This then raises the effective dielectric constant of the polymer and in many cases increases its conductivity. Hence, there have been numerous suggested approaches towards solving the problems of capacitive coupling and increased resistance occurring as a result of a need to formulate smaller dimensioned interconnects that are spaced closer together. A primary difficulty that results is the relative incompatibility of lower resistance materials with the surrounding insulating material.

Silver is one of the best conductors, in that it has the lowest specific resistivity of any metal or alloy. Furthermore, a vacuum is the ultimate dielectric, with air being nearly as good. However, the use of a vacuum introduces additional problems or complexities to the device. The first being the low heat conductivity of the vacuum and the second being the cost of the package required to maintain the vacuum. Air, which has somewhat better thermal conductivity, has its own problems in that both copper and silver react with air to form oxides or other compounds. Alternatively, gold is known to be quite environmentally stable. However it's specific resistivity is higher than that of copper and silver.

To address the problem of increased capacitance, interconnects comprising an air bridge have been developed as described in U.S. Pat. No. 5,891,797. The air bridge is a length of conducting material that extends from a first supported end to a second supported end through an air space such that the bridge is substantially surrounded by air. Consequently, because air has a dielectric constant that is substantially less than that of SiO2, the capacitance between adjacent interconnects is reduced.

However, because the air bridge tends to sag under its own weight, the length of the air bridge is a possible limiting factor. In particular, because the air bridge is only supported at its first and second ends, gravitational forces acting on the air bridge when the bridge is horizontally disposed cause the air bridge to sag such that the unsupported middle of the air bridge is deflected downward with respect to the first and second ends. Because the degree of sagging increases as the length of the bridge is increased, the length of the air bridge cannot exceed that which would cause the air bridge to break or come into contact with another conductor of the device.

According to classical mechanics for simple air bridge structures, the center of the bridge is deflected downward with respect to the supported and constrained ends by an amount δ given by $$\delta = \frac{\rho L^4}{32h^2 E},$$

wherein ρ is the mass per unit volume of the air bridge, L is the length of the air bridge, h is the height of the air bridge, and E is the modulus of elasticity of the air bridge. Consequently, aside from the geometric factors L and h, the deflection δ is proportional to the ratio of (ρ/E). Thus, an air bridge formed of a material having a reduced ratio of (ρ/E) will experience less sagging. If the ends of the bridge are not considered to be constrained then $$\delta = \frac{5\rho L^4}{32h^2 E}.$$

This is the worst case assumption.

| Material | Resistivity (nΩm) | Elastic Modulus (GPa) | Mass Density (mg/m3) | ρ/E |
|---|---|---|---|---|
| Copper | 16.7 | 128 | 8.93 | 0.0698 |
| Silver | 14.7 | 71 | 10.5 | 0.148 |
| Gold | 23.5 | 78 | 19.3 | 0.247 |
| Aluminum | 27.5 | 70 | 2.7 | 0.039 |

The table above illustrates the physical properties of possible air bridge materials. Both copper and silver have resistivities that are substantially less than that of aluminum and, thus, would provide air bridges with reduced resistance. Because copper has a ratio of (ρ/E) which is less than that of silver, a low resistance bridge comprising copper would experience less sagging and, thus, would be more suitable for applications that require bridges having extended lengths. Alternatively, because silver has a resistivity less than that of copper, a bridge comprising silver would be more suitable for applications that require reduced resistance. However, as was pointed out previously, both copper and silver are susceptible to environmental degradation in an air environment.

Gold also has a resistivity less than that of aluminum. Furthermore, gold is not susceptible to environmental degradation in an air environment. However, because the resistivity of gold and the ratio of (ρ/E) of gold are substantially larger those of silver or copper, a bridge formed of gold would have a relatively large resistance and would experience a relatively high degree of sagging.

Various processing techniques may also contribute to the effects of device reliability and environmental degradation. For one, annealing is a process involving heating and cooling of a mechanically work-hardened region, which is designed to effect the microstructure of crystalline materials. Annealing typically softens work-hardened microstructures by relieving residual stress caused by mechanical processes, such as polishing and/or grinding. Additionally, for submicron structures, chemistry is a substantially important variable for establishing high electrical conductivity in conductive interconnects. The working of mechanical processes may significantly decrease electrical conductivity and retard grain development.

As is known in the art, abnormal grain development may be associated with a duplex grain structure caused by the dissolution of oxides during a high temperature annealing process. The propensity for grain coarsening and duplex grains may be attributed to excessive solution temperatures and oxygen concentrations. Unfortunately, coarse grains formed during high temperature anneals may remain present after cooling. In addition, the rate of cooling from high temperature anneals may also detrimentally influence the mechanical properties of materials comprising high levels of impurities. Furthermore, rapid cooling may also result in substantially high, non-equilibrium levels of impurities in solid solution. Alternatively, slow cooling may allow for the interaction between impurities and oxygen, which may lead to subsequent precipitation from solid solution. Typical high temperature annealing techniques may be considered harmful and may detrimentally effect chemical, electrical, and mechanical properties of crystalline materials, wherein localized inhomogeneities may change with deformation and thermal history, metal purity, and oxygen content.

The reduction in conductor size introduces additional problems as the surface to volume ratio increases, as it must with the reduced conductor size, the specific electromigration resistance decreases. This is a direct result of the fact that the surface diffusion rate is higher than the grain boundary diffusion rate which is higher than the "bulk" rate. As the relative surface area increases the surface diffusion rate, which may be up to two orders of magnitude greater than the bulk rate, becomes more and more significant.

From the foregoing, therefore, it will be appreciated that there is a need for an improved air bridge structure for an integrated circuit that not only provides a relatively small resistance but also is extendable over relatively large distances. It should also be appreciated that there exists a need to improve processing methods associated with air bridge structures for the purpose of increased reliability.

SUMMARY OF THE INVENTION

The aforementioned needs are satisfied by one aspect of the present invention which discloses a method and device for forming an electrical interconnect comprising an air bridge structure for electrically connecting at least two circuit elements in an integrated circuit. In order to reduce the electromigration rate of the copper or any other submicron conductor it will be necessary to find ways to reduce the effect of surface diffusion on the electromigration rate. This can be accomplished by coating the surface of the conductor with a thin highly adhesive coating, which has a low solubility in the base conductor. Or if the coating has a significant solubility it must have such a low diffusion rate into the conductor at the processing and use conditions that it does not penetrate the conductor, during the time of service. For a copper conductor, a thin zirconium film can be deposited by selective plating or CVD on to the conductor, after the last high temperature step. The coating material must form an adherent layer upon the surface such that diffusion along the boundary between the coating and the base material is significantly less than the surface diffusion rate of the base material.

The aforementioned needs may be satisfied by a method of forming an air bridge structure between a first and second circuit component on a substrate. In one embodiment, the method may comprise forming a support structure on the substrate, forming vias in support structure above the first and second circuit components, and depositing a conductive layer so as to form vertically extending legs in the vias and a laterally extending member between the upper portions of the vertically extending legs in a manner so as to electrically interconnect the first and second circuit components, wherein forming the laterally extending member results in an increased resistivity through the air bridge structure. The method may further comprise removing the support structure so as to suspend the laterally extending member above the substrate between the first and second circuit components via the vertically extending legs, wherein removing the support structure results in an increased resistivity through the air bridge structure, and processing the air bridge structure by re-crystallizing the laterally extending member and the vertically extending legs, which results in a decreased resistivity through the air bridge structure.

In one aspect, the depositing the conductive layer may include depositing a material with a line resistivity of at least less than that of aluminum. Also, depositing the conductive layer may include depositing a material with a ratio of mass density over modulus of elasticity (E/$\rho$) that is at least greater than gold. In addition, re-crystallizing the laterally extending member may comprises coalescing the grain boundaries in a manner so as to form fewer grain boundaries. Coalescing the grain boundaries may occur at room temperature. Coalescing the grain boundaries may include performing a heat treatment. Coalescing the grain boundaries may improve the electrical properties of the conductive layer. Improving the electrical properties of the conductive layer includes enhancing the electromigration resistance of the conductive layer. Improving the electrical properties of the conductive layer includes enhancing the diffusion resistance of the conductive layer.

In another aspect, the method may further comprise annealing the air bridge structure. Also, forming the laterally extending member includes planarizing the conductive layer using a CMP process. Forming a conductive layer comprises depositing a least one of copper, silver, and gold. In addition, the method further comprises forming an adherent coating on the air bridge structure. Forming the adherent coating on the air bridge structure includes depositing at least one of titanium, zirconium, and hafnium on the air bridge structure.

The aforementioned needs may be satisfied by a method of forming an air bridge structure between a first and second circuit component on a substrate. In another embodiment, the method may comprise forming a support structure on the substrate, forming vias in support structure above the first and second circuit components and depositing a conductive layer so as to form vertically extending legs in the vias and a laterally extending member between the upper portions of the vertically extending legs in a manner so as to electrically interconnect the first and second circuit components, wherein forming the laterally extending member exposes grain boundaries adjacent the surface of the laterally extending member resulting in an increased resistivity through the air bridge structure. The method may further comprise removing the support structure so as to suspend the laterally extending member above the substrate between the first and second circuit components via the vertically extending legs, wherein removing the support structure results in forming grain boundaries in the laterally extending member and the vertically extending legs, which increases resistivity through the air bridge structure, and processing the air bridge structure by coalescing the grain boundaries so as to form fewer grain boundaries, which results in a decreased resistivity through the air bridge structure.

The aforementioned needs may be satisfied by a method of forming an electrical interconnect for an integrated circuit having a substrate with at least two semiconductor components. In still another embodiment, the method may comprise forming a bridge structure having a crystalline microstructure by laterally extending a first material between the at least two semiconductor components in a manner so as to suspend the first material in a gaseous medium above the substrate of the integrated circuit, wherein forming the first material produces grain boundaries in the crystalline microstructure and re-crystallizing the first material in a manner so as to form fewer grain boundaries in the crystalline microstructure, wherein forming fewer grain boundaries improves the electrical properties of the first material. The method may further comprise insulating the first material with a second material so as to substantially reduce environmental degradation of the first material and applying a heat treatment in a manner so as to strengthen the adhesive bond between the first and second material, wherein the heat treatment further improves the electrical properties of the first material.

The aforementioned needs may also be satisfied by an integrated circuit device comprising a semiconductor substrate, at least two circuit components formed on the semiconductor substrate and spaced distally apart, and at least one bridge structure laterally extending between the at least two circuit components in a suspended manner above the semiconductor substrate so as to electrically interconnect the at least two circuit components, and wherein the at least one bridge structure is disposed adjacent a gaseous medium so as to reduce the capacitance of the at least one bridge structure, and wherein the at least one bridge structure comprises a reduced grain boundary component that is processed so as to improve the electrical properties of the at least one bridge structure.

In one aspect, the at least one bridge structure may comprise a conductive material. The conductive material may include copper. The conductive material may include silver. The conductive material may include gold. The conductive material may comprise a resistivity less than that of aluminum. The conductive material may comprise a ratio of mass density over modulus of elasticity (E/$\rho$) that is greater than gold. The at least one bridge structure may be coated with an insulating material so as to improve the environmental degradation resistance of the at least one bridge structure. The insulating material may include at least one of titanium, zirconium, hafnium, chromium, and vanadium. The gaseous medium may comprise air. The gaseous medium may comprise a non-conductive fluid. The non-conductive fluid may include a non-conductive gas. The non-conductive gas may include carbon-dioxide. The gaseous medium comprises an insulating material. The insulating material may comprise at least one of a polymer, a foamed polymer, a polymide, a foamed polymide, an inorganic material, and a porous inorganic material.

From the foregoing, it should be apparent that the electrical interconnect of the present invention and methods of providing the same provide many advantages over interconnect known in the art. In particular, because the bridge section of the interconnect is disposed adjacent an air space instead of a solid insulating material, the bridge may comprise a reduced capacitance. In addition, because the material of the bridge structure is more conductive than that which is used in typical interconnects, the interconnect of the present invention may be formed with an increased length and a reduced cross-sectional area. Moreover, processing the bridge structure so as to coalesce grain boundaries prior to applying the adherent coating may enhance the electrical properties of the bridge structure such that the bridge structure comprises a lower resistivity. These and other objects and advantages of the present invention will become more apparent from the following description taken in conjunction with the accompanying drawings.

DETAILED DESCRIPTION OF THE PREFERRED EMBODIMENT

The illustrated embodiments of the present invention comprise a miniaturized electrical interconnect having improved operating characteristics and methods for providing the same. The electrical interconnect includes a bridge section surrounded by air, referred to hereinbelow as an "air bridge", so as to reduce the capacitance of the interconnect. Air bridges are also described in U.S. Pat. No. 5,891,797 which is incorporated herein by reference in its entirety. As will be described in greater detail below, air bridges formed in accordance with the various aspects of the present invention are provided with reduced resistance and a reduced tendency to sag, thereby enabling them to have a reduced cross-sectional area and to extend across larger distances.

Improved electrical interconnects formed according to the methods of the illustrated embodiments are particularly useful in the manufacture of ultra-high density integrated circuit devices, such as a Dynamic Random Access Memory (DRAM), a microprocessor, or a Digital Signal Processor (DSP). It should be understood, however, that the methods described hereinbelow could be used in any application or structure in which it is desirable to include improved miniaturized electrical interconnects. Furthermore, the methods of the present invention are particularly well-suited for providing improved electrical interconnects on or above a semiconductor substrate, such as a silicon wafer, or substrate assembly, referred to herein generally as "substrate," used in forming any of a number of conventional integrated circuits.

It should be understood that the methods of the present invention are not limited to integrated circuits formed on silicon wafers; rather, other types of wafers (e.g., gallium arsenide, etc.) can be used as well. Thus, the skilled artisan will find application for the processes and materials discussed below for any of a number of devices requiring improved electrical interconnects.

Figure 1:
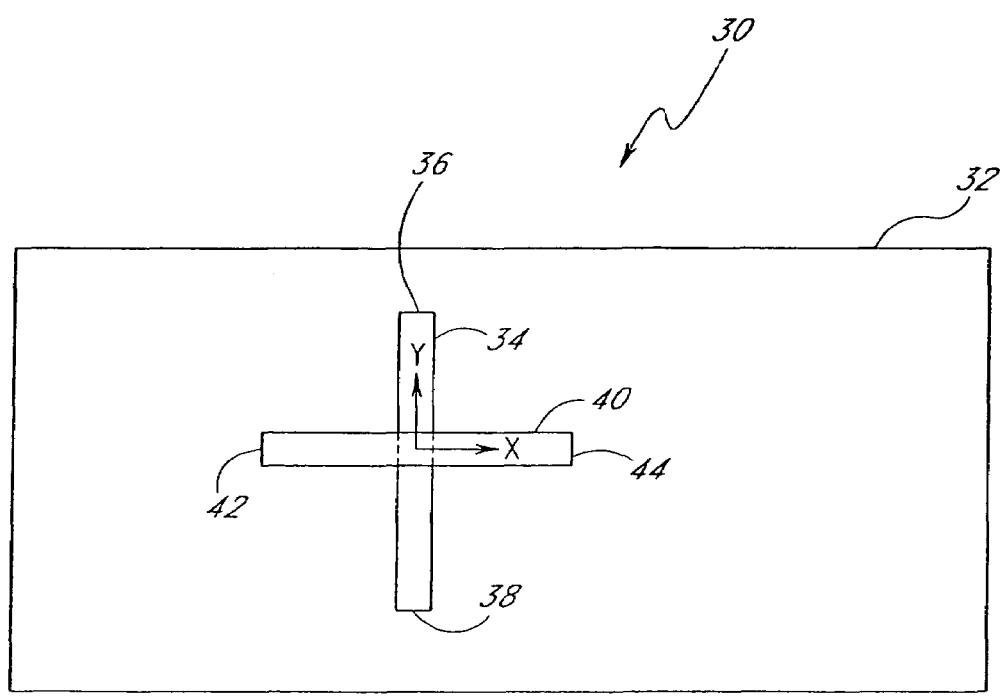
FIG. 1 illustrates a schematic diagram of an integrated circuit device according to one aspect of the present invention, the device comprising at least one electrical interconnect having an air bridge structure.

Reference will now be made to the drawings wherein like numerals refer to like parts throughout. FIG. 1 schematically illustrates an integrated circuit device 30 according to one aspect of the present invention. The integrated circuit 30 comprises a plurality of known circuit components, such as transistors, resistors, capacitors and the like, formed in a well known manner. The circuit components are formed within, on, or above a substrate 32. In one embodiment, the substrate 32 has a planar shape and is aligned in an x-y plane as shown in FIG. 1. The circuit components define a plurality of circuit nodes which are interconnected by way of a plurality of improved electrical interconnects as will be described in greater detail below.

As schematically illustrated in FIG. 1, the integrated circuit comprises a first electrical interconnect 34 extending from a first node 36 to a second node 38 of the integrated circuit 30. The first interconnect 34 has an elongate shape which is shown extending in a linear manner along the y-axis. However, it will be appreciated that, in another embodiment, the first interconnect 30 could have a different shape and extend in a non-linear manner along virtually any direction with respect to the substrate. In one embodiment, the integrated circuit 30 further comprises a substantially similar second electrical interconnect 40 extending along the x-axis from a third node 42 to a fourth node 44 such that the second interconnect 40 overlaps the first interconnect 34 as shown in FIG. 1. While the nodes 36, 38, 42 and 44 are described in this embodiment as being positioned within the substrate 32, it will be appreciated by a person of ordinary skill that the nodes can actually be formed in an insulating layer positioned over the substrate 32. Hence, the use of the bridge structures described herein should not be viewed as being limited to use with nodes formed in the substrate as they can be used between nodes formed in or above the substrate 32.

Figure 2:
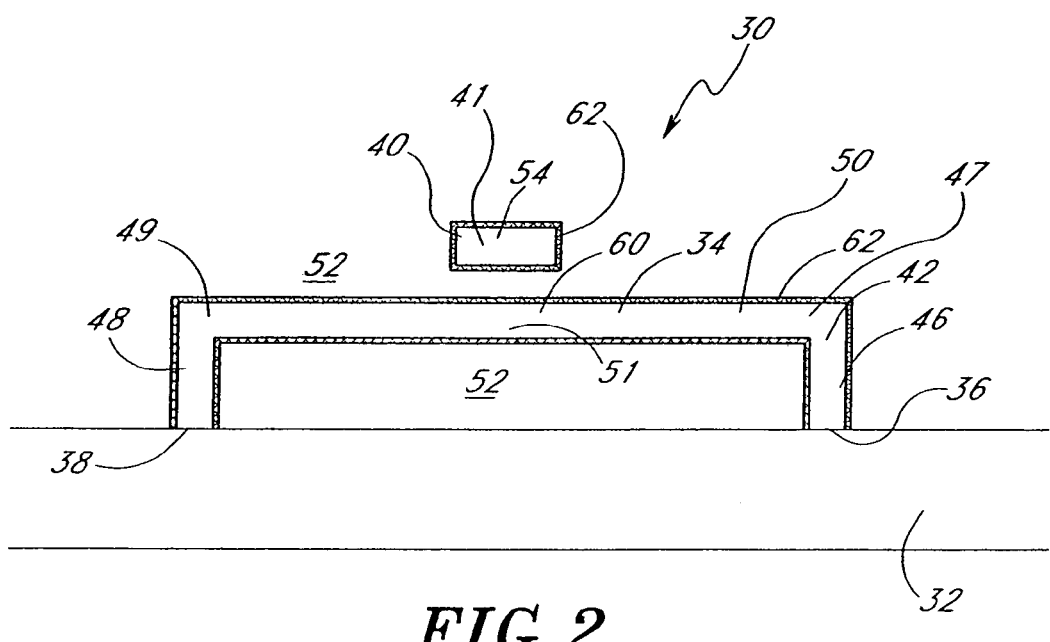
FIG. 2 illustrates a cross-sectional schematic diagram of the air bridge of FIG. 1 as seen along a y-axis.
Figure 3:
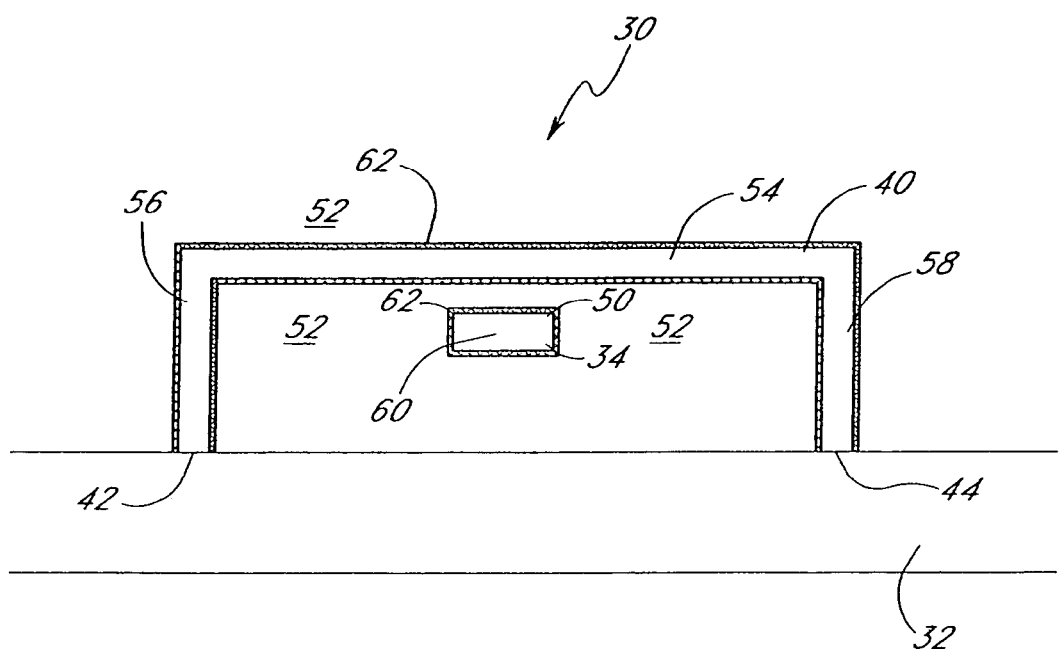
FIG. 3 illustrates a cross-sectional schematic diagram of the air bridge of FIG. 1 as seen along an x-axis.

FIGS. 2 and 3 further illustrate the integrated circuit 30 of FIG. 1, wherein FIG. 2 is a schematic diagram corresponding to a view along the x-axis and FIG. 3 is a schematic diagram corresponding to a view along the y-axis. The first interconnect 34 comprises a first end section 46 extending from the first node 36, a second end section 48 extending from the second node 38, and a bridge section 50 extending between the first and second end sections 46 and 48. The first end section 46 supports a first end 47 of the bridge section 50 and the second end section 48 supports a second end 49 of the bridge section 50. Consequently, gravitational forces acting on the bridge section 50 cause an unsupported midpoint 51 of the bridge section 50 to sag such that the midpoint 51 is downwardly displaced with respect to the ends 47 and 49. As will be described in greater detail below, in one embodiment, the bridge section 50 comprises a material having a reduced ratio of mass density over modulus of elasticity ($\rho/E$) so as to reduce the degree of sagging.

The end sections 46 and 48 and the bridge section 50 comprise a conducting material that provides a conducting path extending between the first and second nodes 36 and 38. Furthermore, the bridge section 50 is disposed in a plane that is outwardly displaced from the plane of the substrate.

Moreover, the bridge 50 extends through a space 52 having a gaseous medium disposed therein such that the bridge section 50 is substantially surrounded by the gaseous medium. In the preferred embodiment, the gaseous medium comprises air or any other low dielectric gaseous mixtures. Consequently, because air has a relatively small dielectric constant, the first interconnect 34 is provided with a relatively small capacitance with respect to nearby conducting elements of the device.

In one embodiment, the first and second end sections 46 and 48 laterally extend from the respective first and second nodes 36 and 38 and the bridge section 50 longitudinally extends therebetween. However, a person skilled in the art will realize that the methods described herein could also be used to form interconnects having an alternative geometry. For example, the end sections could extend from the nodes 36 and 38 with longitudinal components and the bridge section could extend with a lateral component. Furthermore, rather than extending along a plane disposed away the substrate, in another embodiment, the bridge section could extend through a trench formed within the substrate such that the bridge section substantially overlaps the plane of the substrate. Moreover, in yet another embodiment, the electrical interconnect could consist solely of the bridge section such that the bridge section extends directly from the first node to the second node through the trench formed in the substrate or in an insulating layer formed on the substrate.

In one embodiment, the second interconnect 40 comprises a second air bridge 54 which is substantially similar to the air bridge 50 of the first interconnect 34. As shown in FIGS. 2 and 3, the second air bridge extends between laterally disposed first and second end sections 56 and 58 through the air space 52 such that the second bridge 54 is disposed above the first air bridge 50. Thus, because air separates the first and second air bridges 50 and 54, the capacitance between the first and second interconnects 34 and 40 is reduced. Consequently, independent signals propagating along the first and second interconnects 34 and 40 are less likely to interfere with each other and the speed of propagation of signals will be less effected by capacitance.

As shown in FIGS. 2 and 3, the air bridge 50 comprises a core 60 extending along its length that provides the air bridge 50 with desirable electrical and mechanical properties. In particular, to promote conduction along its length, the core 60 preferably comprises a highly conductive material. Furthermore, to reduce sagging, the core 60 preferably comprises a material having a relatively small ratio of mass density over modulus of elasticity ($\rho/E$). As mentioned above in the background section, materials having relatively low resistivity and relatively low $\rho/E$ include copper and silver. In one embodiment, the core 60 comprises copper. In another embodiment, the core 60 comprises silver.

As shown in FIGS. 2 and 3, the air bridge 50 further comprises a tightly adherent coating 62, that is deposited on the core 60 and substantially surrounds the core 60, such that the coating 62 is interposed between the core 60 and the air of the air space 52. In one embodiment, the purpose of the adherent coating 62 is to provide the air bridge 50 with improved electromigration resistance along with desirable environmental properties. In another embodiment, the adherent coating 62 comprises a protective coating that serves as a protective barrier which prevents surface diffusion as well as inhibiting contaminants, such as oxygen, from reaching the core 60. Furthermore, the coating 62 preferably comprises a material having a low solubility with respect to the core 60 that does not readily diffuse into the core and significantly degrade the conductivity of the core 60. Thus, because the core 60 is substantially shielded from the air space 52, the core 60 is able to include environmentally sensitive materials, such as copper or silver, that provide the bridge 50 with reduced resistance and reduced sagging.

In one embodiment, the coating 62 comprises a conducting material, that reduces surface diffusion and resists air molecules from diffusing therethrough and enhances conduction along the bridge 50. For example, the coating can include the reactive elements titanium, zirconium or hafnium. If one of the reactive elements is used, zirconium may be preferred due to its low solubility in both copper and silver.

In another embodiment, the coating 62 comprises an insulating material that inhibits air molecules from reaching the core 60. For example, the coating 62 could comprise an inorganic material such as $Si_3N_4$.

Figure 4:
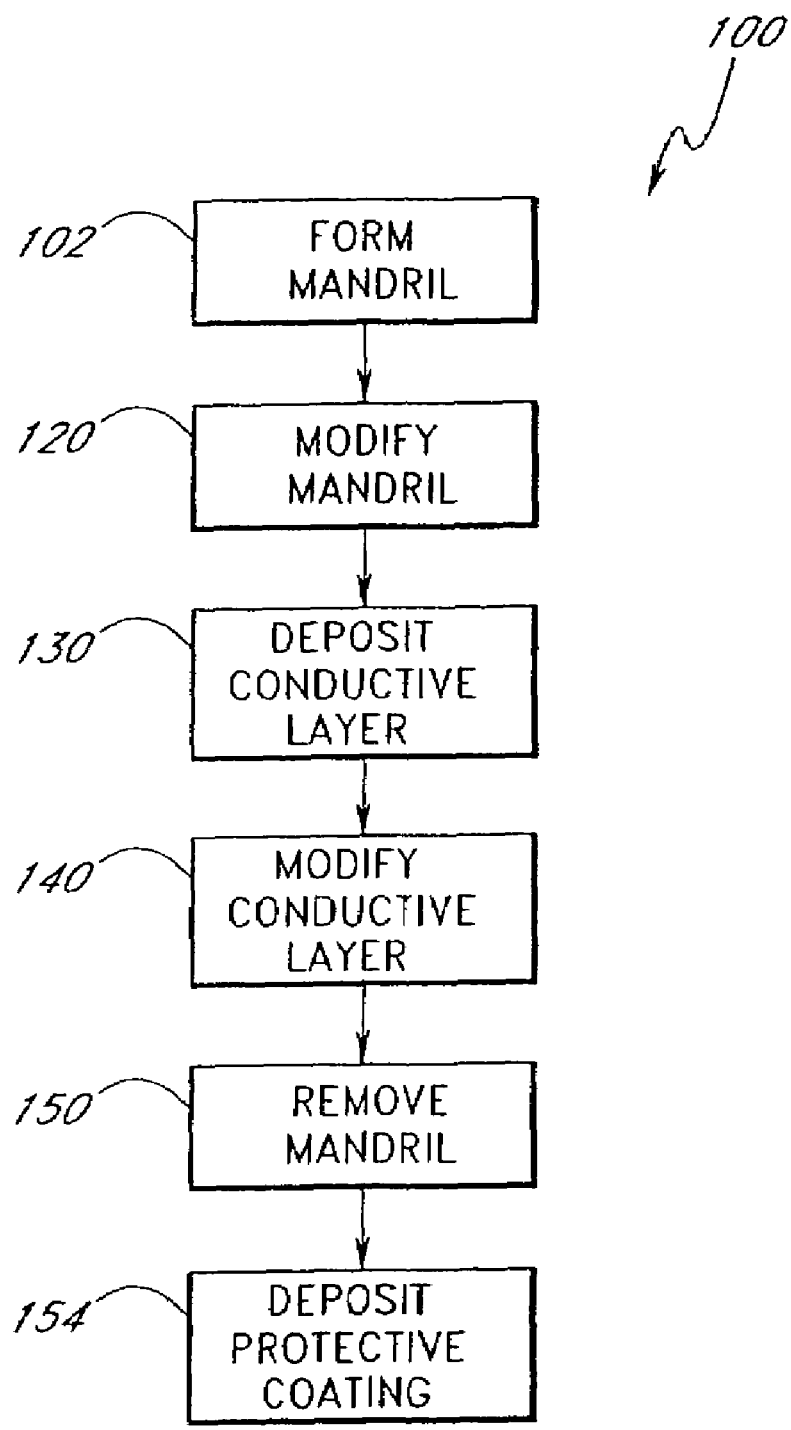
FIG. 4 illustrates a flow chart of one embodiment of a method of forming the electrical interconnect of FIG. 1.
Figure 5:
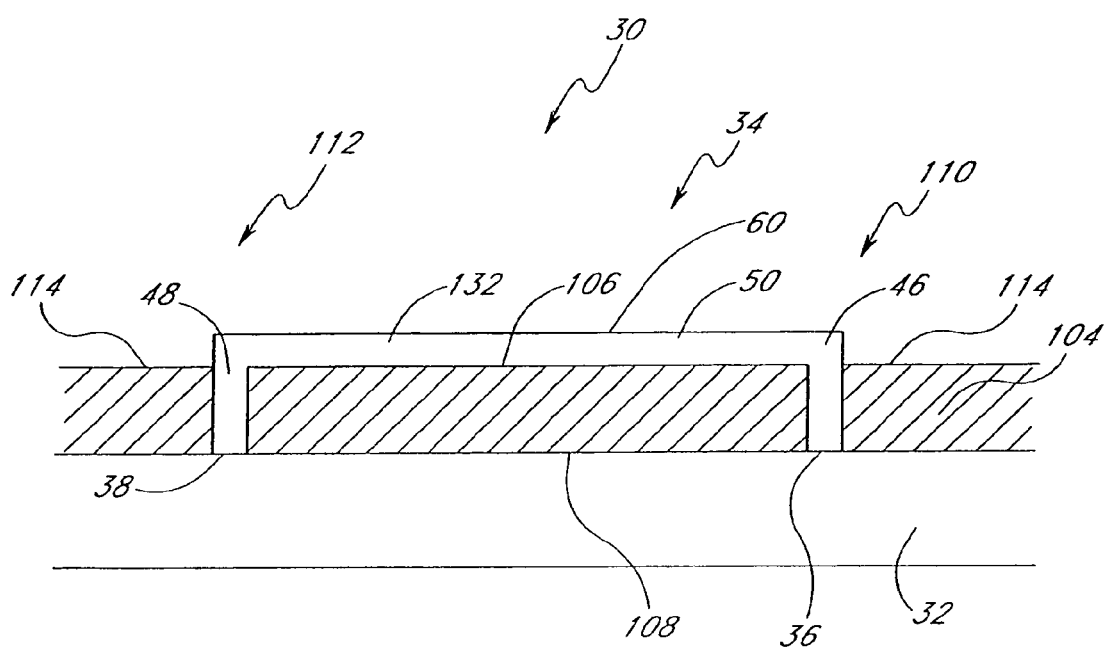
FIG. 5 illustrates a cross-sectional schematic diagram of one embodiment of the electrical interconnect of FIG. 1 in a partially fabricated state according to the method of FIG. 4.

Reference will now be made to FIGS. 4–5 which illustrate a method 100 of forming an individual electrical interconnect according to one embodiment of the present invention. As will be described in greater detail below, the method 100 essentially comprises forming the core 60 of the interconnect 34 and then disposing the coating 62 on the core 60.

As shown in FIG. 4, in one embodiment, the method 100 comprises, in a state 102, forming a temporarily support structure or mandril. The purpose of the mandril is to provide a supporting surface that supports the bridge section of the electrical interconnect during formation of the bridge section. The mandril can be formed from any of a wide variety of materials that provide the electrical interconnect with temporary support and that can subsequently be removed to expose a lower surface of the air bridge section.

For example, as shown in FIG. 5, the temporary support structure may comprise a layer 104 of photoresist which is deposited over the substrate 32 using conventional deposition techniques. The photoresist layer 104 is deposited with a substantially uniform thickness such that the substrate 32 is substantially covered by the layer 104 and the first and second nodes 36 and 38 are disposed under the layer 104. The thickness of the layer 104 is selected so as to provide a desired separation distance between a lower surface 106 of the bridge 50 and an upper surface 108 of the substrate 32.

As shown in FIG. 4, the method 100 further comprises, in a state 120, modifying the mandril so as to expose the first and second nodes 36 and 38. In particular, using conventional etching techniques, first and second vias 110 and 112 are formed in the mandril that vertically extend from an upper surface 114 of the mandril 104 to the respective first and second nodes 36 and 38 of the circuit 30 as shown in FIG. 5.

As shown in FIGS. 4 and 5, the method 100 further comprises, in a state 130, depositing a conducting layer 132 over the mandril 104 such that the conducting layer 132 horizontally extends across the upper surface 114 of the mandril between the vias 110 and 112, so as to subsequently form the core 60 of the bridge 50, and vertically extends through the vias 110 and contact the first and second nodes 36 and 38 so as to provide the end sections 46 and 48 of the interconnect 34. Because the conducting layer 132 will eventually become the core 60 of the first electrical interconnect 34, the conducting layer 132 preferably comprises a highly conductive material having a relatively small ratio of ($\rho/E$), such as silver or copper, thereby providing the electrical interconnect 34 with a relatively small resistance and a reduced tendency to sag as will be described in greater detail hereinbelow.

As shown in FIGS. 4 and 5, the method 100 further comprises, in a state 140, modifying the conductive layer so as to define the shape of the core 60 of the electrical interconnect 34. For example, the core 60 can be shaped by employing conventional pattern and etching processes that leave behind the first and second end sections 46 and 48 vertically extending from the respective nodes 36 and 38 and also leave behind the bridge section 50 horizontally extending between the end sections 46 and 48 as shown in FIG. 5.

However, it will be appreciated that the core 60 of the interconnect 34 could be formed in an alternative manner without departing from the spirit of the present invention. For example, in an alternative embodiment, the core 60 could be formed by defining a trench in the mandril, depositing conductive material in the trench, and removing excess conductive material using a conventional chemical mechanical planarization process.

As shown in FIG. 4, the method 100 further comprises, in a state 150, removing the mandril so as to expose the lower surface 106 of the core. In one embodiment, the photoresist layer 104 is removed by exposing the photoresist layer 104 to a known etchant that selectively removes the photoresist 104 layer and does not remove the core 60 of the interconnect 34.

As shown in FIG. 4, the method 100 further comprises, in a state 154, disposing the adherent coating 62 on the exposed surfaces of the core 60 of the electrical interconnect 34. In one embodiment, disposing the adherent coating 62 comprises depositing a layer of conductive material selected from the group comprising the noble metals gold, platinum, palladium, iridium, and the reactive elements titanium, zirconium and hafnium. Furthermore, the conductive material of the coating 62 can be deposited using a known electroless plating process, or a known chemical vapor deposition process (CVD), such as Plasma Enhanced Chemical Vapor Deposition (PECVD).

In one embodiment, disposing the coating 62 comprises depositing an insulating material. For example, the insulating material can comprise an inorganic material, such as $Si_3N_4$, which can be deposited using PECVD. If diffusion of the coating 62 into the core 60 is a concern, such diffusion can be reduced by not exposing the bridge 50 to elevated temperatures. Preferably, the conductive material is deposited so that the material only deposits on the core 60.

In one embodiment, the bridge section 50 of the first interconnect 34 has a rectangular cross-sectional shape with a width approximately equal to 0.25 microns and a height approximately equal to 0.25 microns. Consequently, the bridge section 50 comprising the copper core 60 is able to span a distance of 0.25 mm with a worst case sagging deflection approximately equal to 0.0065 microns. Furthermore, at this length, the bridge section 50 provides a resistance of only 67 ohms. Alternatively, if the core 60 is formed of silver, the bridge section 50 has a resistance approximately equal to 59 ohms and a sagging deflection approximately equal to 0.014 microns. In comparison, a similarly shaped aluminum bridge section would provide a substantially larger resistance approximately equal to 110 ohms and experience a sagging deflection approximately equal to 0.0035 microns.

As can be seen from the above example the limiting factor for Long Aluminum Bridge Structures is the line resistivity not the tendency to sag. If 50 ohms were the limit then Copper and Silver would both be marginally acceptable at this dimension while Aluminum would be unacceptable.

Preferably, the coating 62 has a thickness that substantially inhibits contaminants, such as oxygen, residing in the air space 52 from reaching the core as well as adhering tightly to the core such that surface diffusion is significantly reduced. For example, in one embodiment, the coating 62 including one of the conducting materials listed above has a thickness approximately between 20 Å and 40 Å. In another embodiment, the coating 62 including one of the insulating materials listed above and has a thickness approximately between 10 Å and 100 Å.

Figure 6:
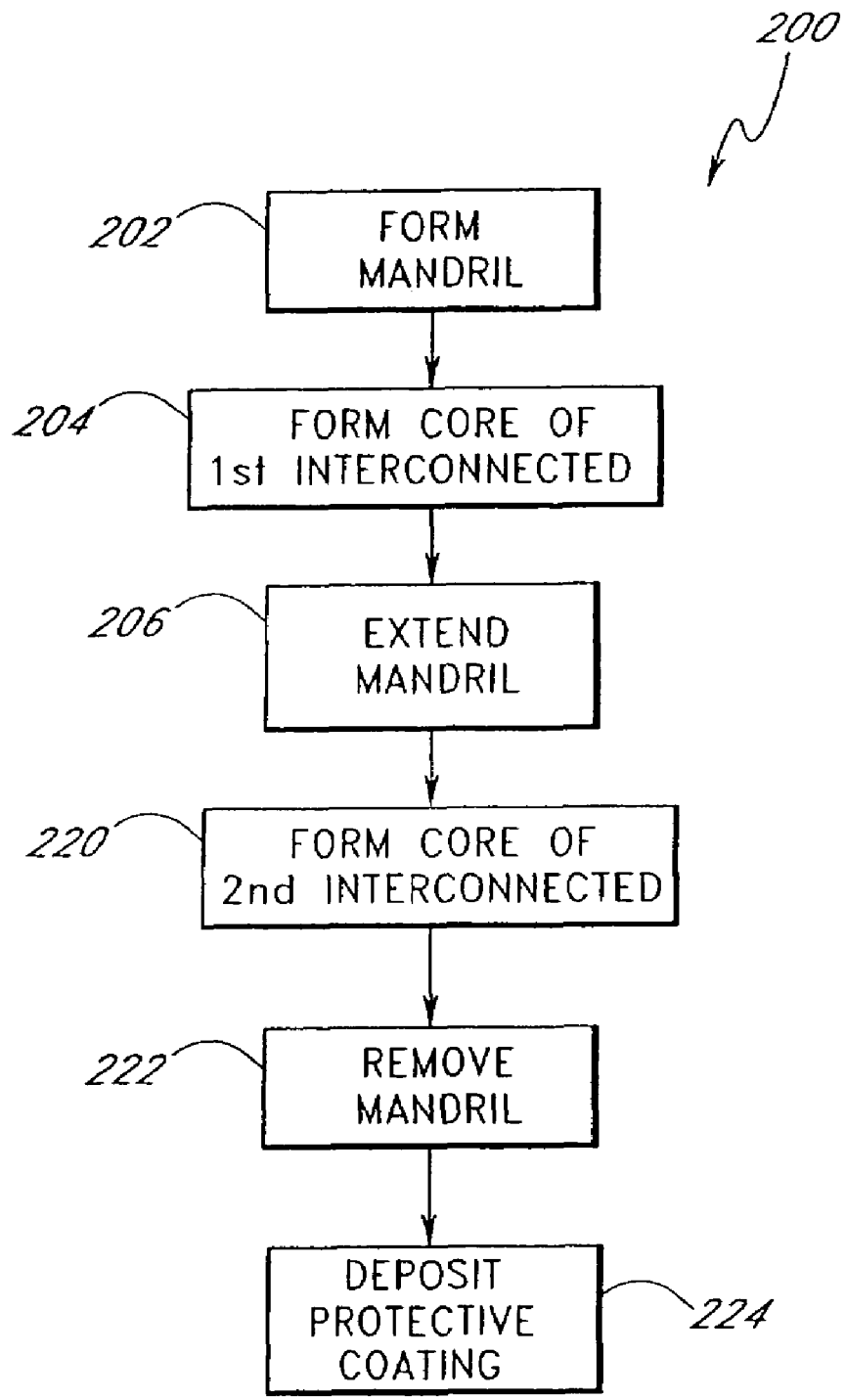
FIG. 6 illustrates a flow chart of one embodiment of a method of forming adjacent electrical interconnects having overlapping air bridge sections.
Figure 7:
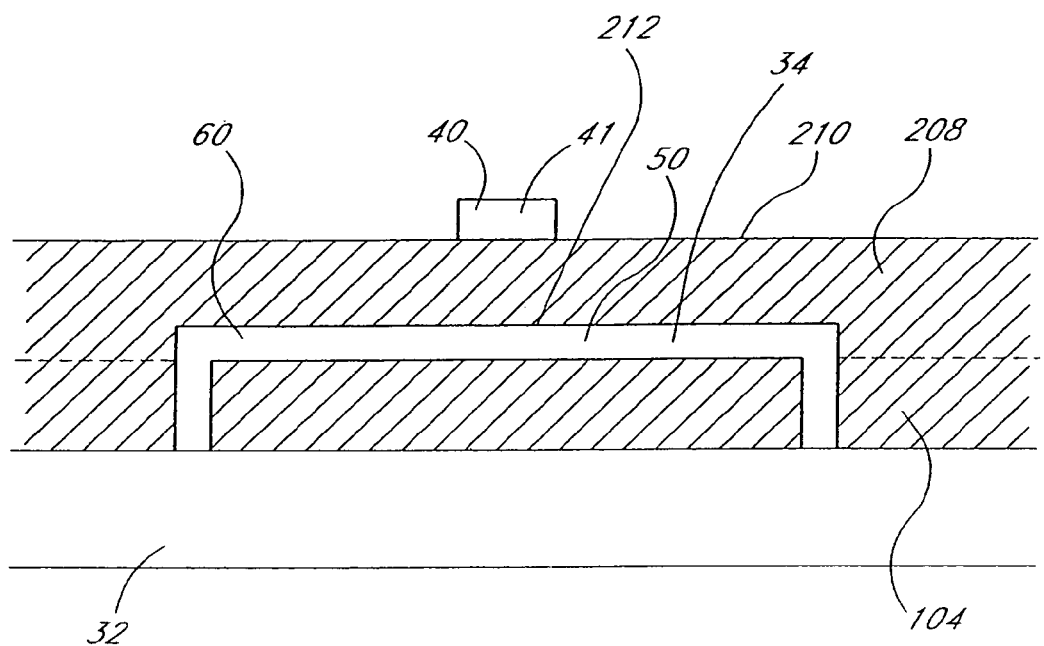
FIG. 7 illustrates one embodiment of a cross-sectional schematic diagram of the electrical interconnects of FIG. 1 in a partially fabricated state according to the method of FIG. 6.

Reference will now be made to FIGS. 6–7 which illustrate a method 200 of forming a plurality of adjacent electrical interconnects having overlapping air bridge sections in accordance with yet another embodiment of the present invention. As shown in FIG. 6, the method 200 comprises forming the mandril 104 in a state 202, and forming the core 60 of the first interconnect 34 above the mandril in a state 204 in the manner described above in connection with FIG. 4.

As shown in FIGS. 6 and 7, The method further comprises, in a state 206, extending the mandril 104 with a second photoresist layer 208 that covers the core 60 of bridge section 50 of the first interconnect. The purpose of the second layer 208 is to support and elevate a core 41 of the second interconnect 40 above the first core 60. The second layer 208 includes an upper surface 210 which is displaced above an upper surface 212 of the first core 60. The thickness of the second layer 208 is selected so as to provide a desired distance between the upper surface 212 of the first core 60 and the upper surface 210 of the second photoresist layer 208.

As shown in FIG. 6, the method further comprises forming the second interconnect 40, in a state 220, so that the second interconnect 40 extends between the third and fourth circuit nodes 42 and 44, of the integrated circuit (FIGS. 2 and 3). The second interconnect 40 is preferably formed using the methods described above in connection with FIG. 4; i.e. forming vias in the mandril layers 104, 208, depositing a layer of conducting material over the mandril, and patterning the conducting material. Furthermore, the overlapping core 41 of the second interconnect 40 preferably extends along a direction that is perpendicular to that of the first interconnect 34 and 40 so as to reduce capacitive coupling between the first and second interconnects.

As shown in FIG. 6, the method further comprises, in a state 222, removing the mandril. In one embodiment, removing the mandril comprises removing the mandril layers 104 and 208 after completing the cores 60 and 41 of the respective electrical interconnects 34 and 40. In particular, after forming the first and second cores 60 and 41, the first and second photoresist layers 104 and 208 are removed in a single etching process. However, it will be appreciated that, in another embodiment, the first madril layer 104 could be removed subsequent to forming the first core 60 in a first etching process and the second madril layer 208 could be removed in a separate second etching process subsequent to forming the second core 41.

As shown in FIG. 6, the method 200 further comprises depositing the adherent coating 62 in a state 224. In one embodiment, the adherent coating 62 is simultaneously deposited on the cores 60 and 41 of the first and second interconnects 34 and 40 in the manner described above in connection with FIG. 4. The advantage of simultaneously depositing the coating on both cores 60 and 41 is that fewer processing steps are needed. However, it will be appreciated that each of the cores 60 and 41 could be coated during separate deposition stages without departing from the spirit of the present invention.

It will be appreciated that the electrical interconnect and methods for providing the same of the present invention provide many advantages. In particular, because the interconnect includes the air bridge which is surrounded by air, the interconnect is provided with a reduced capacitance. Consequently, the interconnect is less susceptible to the problems of signal delay and signal cross-talk. Furthermore, because the core of the air bridge is formed of highly conductive material, the air bridge is able to have a reduced resistance, thereby further reducing signal delays. Moreover, because the core of the air bridge is formed of a material having a relatively low ratio of ρ/E, the air bridge is less susceptible to the problems of sagging. Thus, the air bridge is less likely to fracture and/or contact adjacent structures of the integrated circuit, thereby allowing adjacent interconnects to be spaced more closely together and span larger distances. Additionally, because the core of the air bridge is surrounded by the adherent coating, the surface diffusion rate of the core material will be substantially reduced thus increasing the electromigration resistance of the structure. The oxygen from the air surrounding the air bridge is also inhibited from reacting with the core which would otherwise contaminate the core which could possibly increase the resistance of the core and decrease the mechanical strength of the core.

Figure 8:
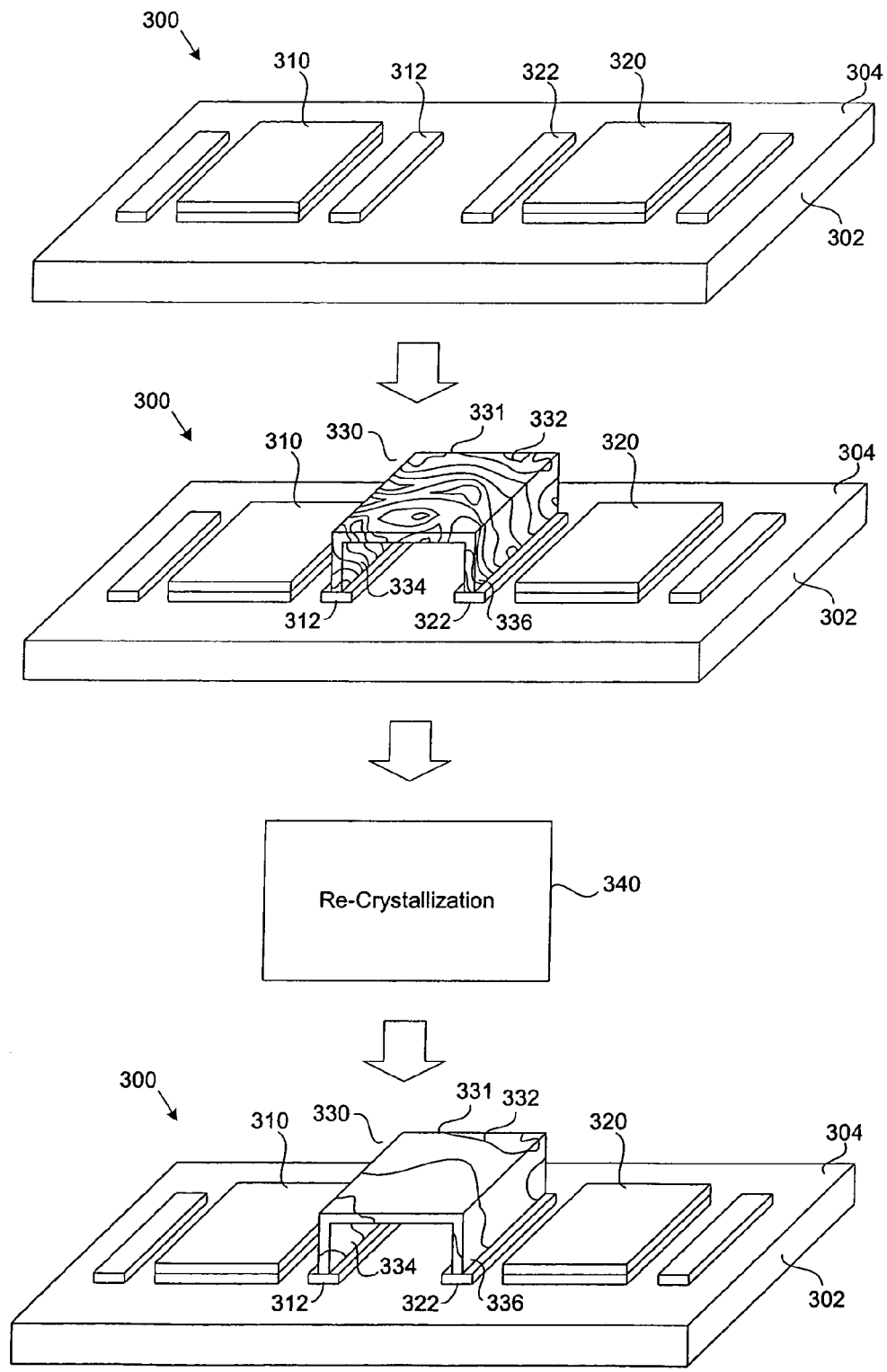
FIG. 8 illustrates one embodiment of an integrated circuit having an air bridge electrical interconnect interposed between two circuit elements.

FIG. 8 illustrates one embodiment of an integrated circuit 300. The integrated circuit 300 comprises a substrate 302 having an upper surface 304, a first circuit element 310 having a first mounting region 312, and a second circuit element 320 having a second mounting region 322. The circuit elements 310, 320 may comprise generally known transistors or other types of circuit elements, such as resistors and capacitors, having a plurality of mounting regions without departing from the scope of the present invention. The first and second mounting regions 312, 322 function as electrical contact points for the first and second circuit elements 310, 320, respectively. Additionally, the first and second mounting regions 312, 322 may be formed in a known manner with a conductive material, such as polysilicon, aluminum, copper, or silver using known metallization and/or deposition techniques, such as CVD and damascene processes.

In one aspect, the illustrated substrate 302 may comprise a conventional silicon wafer, but may generally encompass structures comprising semiconductor material, including, but not limited to, bulk semiconductor materials such as a semiconductor wafer (either alone or in assemblies comprising other materials thereon), and semiconductive material layers (either alone or in assemblies comprising other materials). In addition, the term "substrate" may also encompass any supporting structures, including, but not limited to, the semiconductive substrates described above. Furthermore, when reference is made to substrate within the following description, previous process steps may have been utilized to form regions, structures, or junctions in or on its base semiconductor structure or foundation.

FIG. 8 further illustrates one embodiment of the formation of an electrical interconnect 330. In this particular embodiment, the electrical interconnect 330 comprises an air bridge structure that is formed to laterally extend between the first and second circuit elements 310, 320 in a suspended manner above the substrate 302 so as to electrically interconnect the at least two circuit elements 310, 320. A first distal end of the air bridge structure 330 is attached to the first mounting region 312 of the first circuit element 310 and a second distal end of the air bridge structure 330 is attached to the second mounting region 322 of the second circuit element 320 so as to electrically interconnect the first and second circuit elements 310, 320. In one aspect, the plane of the air bridge structure 330 may substantially parallel the plane of the substrate surface 304. It should be appreciated that the plane of the air bridge structure 330 may vary in orientation, and the height at which the air bridge structure 330 is suspended may vary in magnitude without departing from the scope of the present invention.

As illustrated in FIG. 8, the electrical interconnect or air bridge structure 330, in one embodiment, may comprise a laterally extending member 331, a first vertically extending leg 334, and a second vertically extending leg 336. The laterally extending member 331 may comprise a substantially planar structure that is substantially parallel to the substrate 302. The first vertically extending leg 334 may be interposed between the first distal end of the laterally extending member 331 and the first mounting region 312 of the first circuit element 310. The second vertically extending leg 336 may be interposed between the second distal end of the laterally extending member 331 and the second mounting region 322 of the second circuit element 322. In one aspect, the first and second vertically extending legs 334, 336 distally extend from the substrate 302 in a substantially perpendicular manner and form an electrical contact with the laterally extending member 331. It should be appreciated that the orientation and height at which the laterally extending member is suspended above the substrate 302 may vary and depend on the length of the vertically extending legs 334, 336' without departing from the scope of the present invention.

It should be appreciated that the electrical interconnect or air bridge structure 330 may comprise the scope and functionality of the bridge section 50 as described with reference to FIGS. 1–3 and may be formed in a manner as previously described without departing from the scope of the present invention. In addition, the electrical interconnect or air bridge structure 330 may comprise a conductive material, such as copper or silver, that may adapted to substantially improve the electromigration as well as the electrical properties of the air bridge structure 330.

As further illustrated in FIG. 8, the electrical interconnect or air bridge structure 330 may comprise a plurality of surfaces with exposed grain boundaries 332. Grain boundaries may appear as irregular crystalline lattice boundaries where grain interfaces coalesce. The exposed grain boundaries 332 may be the result of using a CMP process to planarize the upper surface of the air bridge structure 330. Otherwise, exposed grain boundaries 332 near the surfaces may be the result of deposition irregularities during metallization. CMP processes may cause mechanical deformation of surfaces due to the applied mechanical polishing effects of rotating components used during the CMP process. Work-hardened materials tend to adversely affect the electrical properties of crystalline structures.

As layers of material are polished away in a substantially uniform manner, the surfaces become work-hardened and grain boundaries 332 are exposed near the surfaces. Beneficially, CMP process creates substantially uniform surfaces, but CMP processes tend to expose substantially large quantities of grain boundaries 332 near the surfaces. Unfortunately, an increase in the number of exposed grain boundaries 332 tends to increase surface diffusion and grain boundary diffusion of impurities into the structure, which may detrimentally effect the integrity and purity of composition. When impurities diffuse into the structure, a reduced integrity of composition results, wherein undesirable electrical properties may also result, which may lead to an increased resistivity or reduced conductivity of the structure. In addition, the number exposed grain boundaries 332 may also lead to increased surface electromigration and grain boundary electromigration, which may detrimentally effect the reliability of the device.

In one aspect, electromigration may be induced by an electric current in the bulk material and may refer to the directed motion of atoms at solid surfaces, grain boundaries, and grain interfaces. The Applicant considers electromigration as a key factor in determining the reliability of integrated circuits. As integrated circuit miniaturization continues and component densities increase, failures may occur when the interconnect line dimensions are relatively similar in size to or smaller than the grain proportions of the material. In one embodiment, grain boundaries no longer provide connected diffusion paths along the conductive path. Instead, failure occurs due to intragranular voids, which may nucleate at the edges of the conductive path or interconnect path, migrate in the current direction, and collapse. The proposed failures may also comprise diffusive displacements at the terminals of the interconnect line that may inhibit electrical contact.

Both of these failure modes may be affected by the microstructure of the interconnect line and may be delayed or overcome by metallurgical changes that alter the crystalline microstructure. When electrons are conducted through a metal, they interact with imperfections in the lattice structure of the atoms and scatter. Scattering occurs whenever an atom is out of place for any reason. Thermal energy produces scattering by causing atoms to vibrate. This may be considered the source of resistance of conductive materials. The higher the temperature, the more out of place the atom is, the greater the scattering and the greater the resistivity. Under these conditions, electromigration may lead to the electrical failure of interconnects in relatively short times, which may reduce the lifetime of the integrated circuit to an unacceptable level.

Advantageously, electromigration and diffusion may be deterred by coalescing grain boundaries or re-crystallizing the crystalline microstructure of the electrical interconnect or air bridge structure 330 in a manner that will be described in greater detail herein below. As is illustrated in FIG. 8, by allowing the structural composition of the air bridge structure 330 to re-crystallize 340, the quantity of exposed grain boundaries 332 at the surfaces may be reduced. In one aspect, the process of re-crystallization comprises a change in the grain structure of a material during which the deformed grains, strain hardened by working, become new unstrained grains. Re-crystallization promotes grain development, wherein individual grains coalesce to form larger and fewer grains. As the material re-crystallizes, minute crystals may appear in the grains of the microstructure. These minute crystals may comprise the same composition and lattice structure as the original undeformed grains, which may comprise substantially uniform dimensions. The minute crystals may nucleate at the most drastically deformed portions of the grain, such as the grain boundaries. The cluster of atoms from which the re-crystallized grains are formed may comprise a nucleus. Re-crystallization takes place by a combination of nucleation of the strain free grains and the development of these nuclei.

In one aspect, the temperature at which material re-crystallizes and/or coalesces is dependent on the characteristics of the material itself. The material used to form the air bridge structures may comprise, at least in part, various metals, such as copper, silver, gold, platinum, palladium, iridium, and various reactive elements, such as titanium, zirconium, and hafnium or some combination thereof. It should be appreciated that, for example, if one of the reactive elements is used, zirconium may be preferred due to its low solubility in both copper and silver. It should be appreciated by skilled in the art that the rate and temperature of recrystallization depends not only on the material but also the extent of prior cold work. Below is one embodiment of a table of approximate re-crystallization temperatures for the above-mentioned materials.

| Material | Approximate Re-crystallization Temperature |
|----------|--------------------------------------------|
| copper   | 200–400° C. |
| silver   | 200–400° C. |
| gold     | 200° C. |
| platinum | 400° C. |

As a result of reducing the number of exposed grain boundaries near the surface of the electrical interconnect or air bridge structure 330, improved electrical properties may be achieved from an increase in the electromigration resistance and an increase in the diffusion resistance of the re-crystallized microstructure. To further enhance the electromigration resistance and the diffusion resistance, the air bridge structure 330 may be coated with an insulating material in a manner as previously described. Advantageously, improved electrical properties of the air bridge structure 330 may increase the reliability and structural integrity of the air bridge structure 330. Beneficially, by allowing re-crystallization to occur, a reduction in the quantity of exposed grain boundaries is achieved.

Figure 9A:
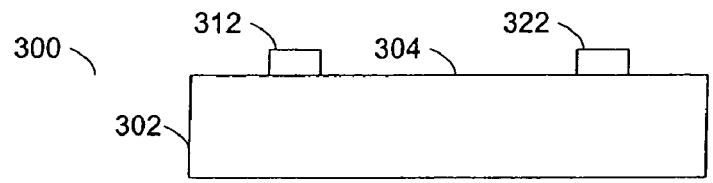
FIGS. 9A–9H illustrate one embodiment of forming the air bridge electrical interconnect of FIG. 8 with enhanced electrical properties including improved electromigration properties.
Figure 9B:
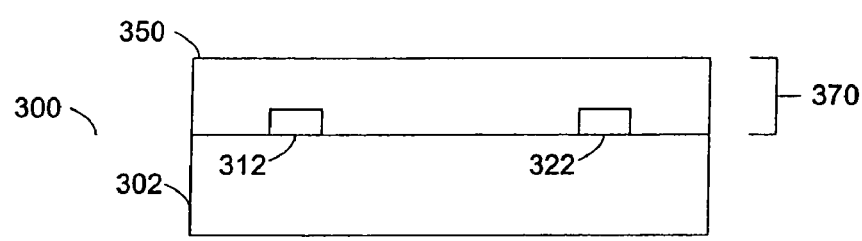

FIGS. 9A–9H illustrate one embodiment of forming the electrical interconnect 300 of FIG. 8 with enhanced electrical properties. As illustrated in FIG. 9A, the substrate 302 may comprise an upper surface where the first and second mounting regions 312, 322 are positioned in a manner as described in FIG. 8. FIG. 9B illustrates the deposition of a support layer 350 that may be used to form a temporary support structure, such as the previously described mandril. The support layer 350 may comprise an insulating material, such as silicon-dioxide, that may be globally deposited so as to overlie the substrate 302 and the mounting regions 312, 322 in a generally known manner using deposition techniques, such as chemical vapor deposition (CVD). In one embodiment, the support layer 350 may be planarly etched to a first height 370 using generally known chemical-mechanical polishing (CMP) techniques.

Figure 9C:
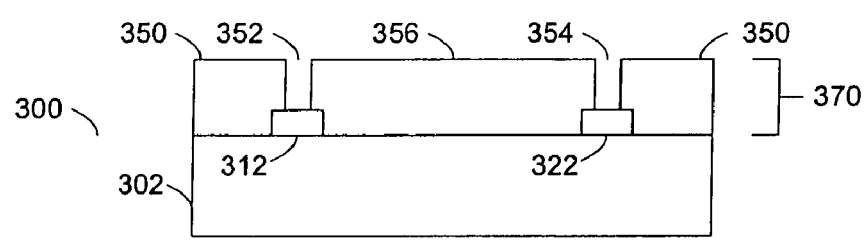

FIG. 9C illustrates the formation of a first and second via 352, 354 and a mandril or temporary support structure 356 in the support layer 350. The vias 352, 354 may be formed using a generally known pattern and etch technique, wherein the first via 352 is etched in a manner so as to expose the upper surface of the first mounting region 312, and the second via 354 is etched in a manner so as to expose the upper surface of the second mounting region 322. During etching of the vias 352, 354, the temporary support structure 356 may be formed using pattern and etch techniques in a similar manner that is generally known. In one embodiment, the temporary support structure 356 may be etched so as to retain the first height 370 as described with reference to the support layer 370 in FIG. 9B. Moreover, the temporary support structure 356 will provide support for the laterally extending member 331 during deposition in a manner that will be described in greater detail herein below.

Figure 9D:
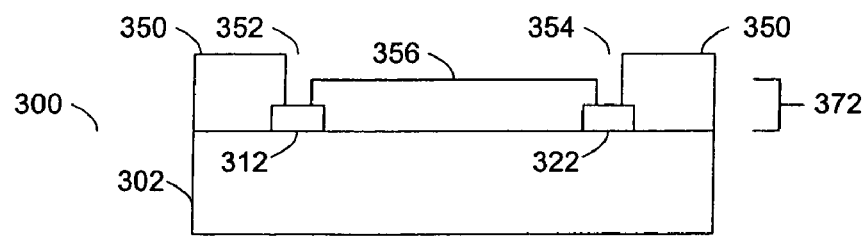

FIG. 9D illustrates the temporary support structure 356 in a modified form so as to define a second height 372 that is at least smaller than the first height 370. In one embodiment, the first height 370 of the temporary support structure 356 may be reduced using generally known pattern and etch techniques to the second height 372 so that the support layer remnants 350 retain the first height 370 and the temporary support structure 356 comprises the second height 372 as illustrated in FIG. 9D.

Figure 9E:
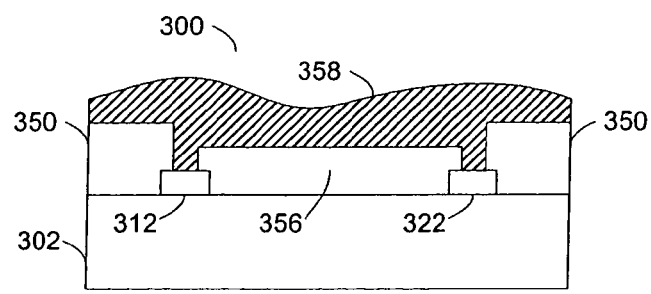

FIG. 9E illustrates the deposition of a conductive layer 358 that may be used to form the laterally extending member 331 and the vertically extending legs 334, 336 of the air bridge structure 330. The conductive layer 358 may comprise a conductive material, such as aluminum, copper, silver, or gold, that may be globally deposited so as to overlie the insulation layer 350 including the temporary support structure 356. The conductive material may also be deposited into the vias 352, 354 in a similar manner. The conductive material may be deposited in a generally known manner using known deposition techniques, such as a chemical vapor deposition (CVD), plasma enhanced CVD (PECVD), vacuum evaporation electroplating, or sputtering. As illustrated in FIG. 9D, it should be appreciated that, due to global deposition techniques, the conductive layer 358 may comprise a non-planar upper surface.

Figure 9F:
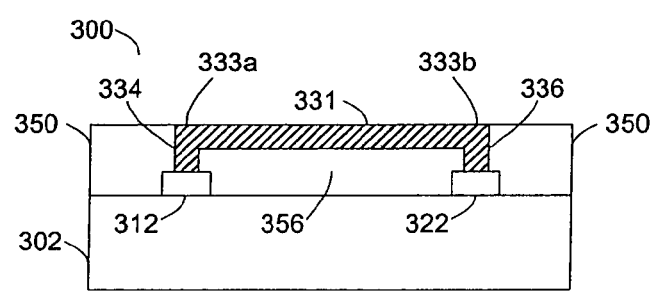

FIG. 9F illustrates planar processing of the conductive layer 358 so as to form the laterally extending member 331 of the air bridge structure 330. In one embodiment, a chemical-mechanical polishing (CMP) process may be utilized to evenly planarize the non-planar surface of the conductive layer 358. The CMP planarization process applies a substantially uniform material removal rate across the plane of the substrate surface 304, which substantially ensures that the conductive layer 358 is uniformly reduced in height across the plane of the substrate surface 304 until the support layer remnants 350 are reached. Unfortunately, as previously described in FIG. 8, the planar processing of the conductive layer 358 may create work-hardened surfaces and expose grain boundaries adjacent the upper surface of the conductive layer 358. Consequently, the planar processing may adversely affect the electrical properties of the air bridge structure 330. Advantageously, the grain boundaries will be allowed to coalesce in FIG. 9G so as to improve the crystalline structure, which improves the electrical properties of the air bridge structure 330.

FIG. 9F further illustrates one embodiment of forming the laterally extending member 331 of the air bridge structure 330. As illustrated in FIG. 9F, a first distal end 333a of the laterally extending member 331 forms an electrical contact with the upper portion of the first vertically extending leg 334, and a second distal end 333b of the laterally extending member 331 forms an electrical contact with the upper portion of the second vertically extending leg 336. It should be appreciated that the air bridge structure 330 electrically interconnects the first mounting region 312 with the second mounting region 322, wherein the formation of the laterally extending member 331 and the vertically extending legs 334, 336 forms the electrical interconnection between the first and second mounting regions 312, 322 as illustrated in FIG. 9F.

Figure 9G:
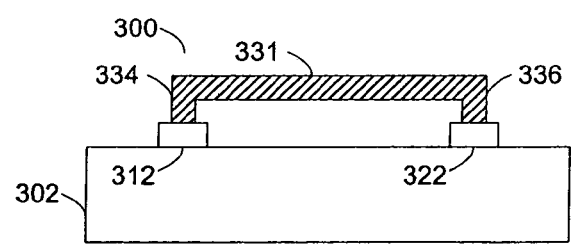

FIG. 9G illustrates the removal of the support layer remnants 350 and the temporary support structure 356 in a manner so as to leave the air bridge structure 330 intact. As illustrated in FIG. 9G, the laterally extending member 331 is suspended above the substrate 302 via the vertically extending legs 334, 336 and positioned so as to laterally extend between the upper portions of the vertically extending legs 334, 336. In one embodiment, the support material may be removed in a generally known manner using pattern and etch techniques including acid washes.

Unfortunately, the removal of the support material may deform the surfaces of the laterally extending member 331 and the vertically extending legs 334, 336, which may adversely affect the electrical properties of the air bridge structure 330. Therefore, at this point in the formation process, the air bridge components 331, 334, 336 are processed in a manner so as to coalesce the exposed grain boundaries so as to improve the crystalline structure of the components 331, 334, 336 and reduce the quantity of grain boundaries in a manner as previously described with reference to FIG. 8. Advantageously, as a result of coalescing the grain boundaries of the air bridge components 331, 334, 336, the air bridge structure 330 has improved electrical properties, which results in a more reliable device as previously described in FIG. 8.

Figure 9H:
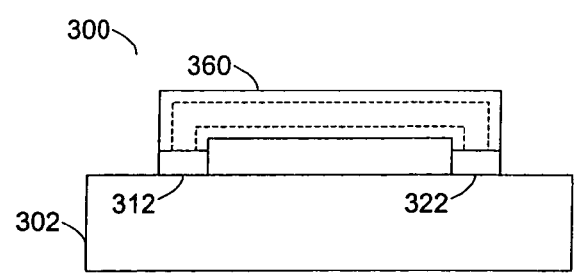

FIG. 9H illustrates the formation of a adherent coating 360 on the surfaces of the air bridge structure 330. The adherent coating 360 may be deposited in a manner as previous described. It should be appreciated that the adherent coating may further enhance the electrical properties of the air bridge structure 330 in a manner as previously described. It should also be appreciated that the adherent coating 360 may comprise the scope and functionality, including the dimensions and shape, of the adherent coating 62 as described with reference to FIGS. 4–7. Moreover, it should be appreciated that the adherent coating 62, in one embodiment, may comprise a protective coating that serves as a protective barrier which prevents surface diffusion as well as inhibiting contaminants, such as oxygen, from reaching the core 60.

Advantageously, electromigration and electron scattering may be deterred by coalescing grain boundaries and/or re-crystallizing the crystalline microstructure of the electrical interconnect or air bridge structure 330. By re-crystallizing the structural composition of the air bridge structure 330, the quantity of exposed grain boundaries at the surfaces may be reduced. In one aspect, the process of re-crystallization may comprise improving the grain structure of the conductive material during which the deformed grains, strain hardened by planar processing, become new unstrained grains.

As preciously described, re-crystallization promotes grain development, wherein individual grains coalesce to form larger and fewer grains. As the material re-crystallizes, minute crystals may appear in the grains of the microstructure. These minute crystals may comprise the same composition and lattice structure as the original undeformed grains, which may comprise substantially uniform dimensions. The minute crystals may nucleate at the most drastically deformed portions of the grain, such as the grain boundaries. The cluster of atoms from which the re-crystallized grains are formed may comprise a nucleus. Re-crystallization takes place by a combination of nucleation of the strain free grains and the development of these nuclei.

Figure 10:
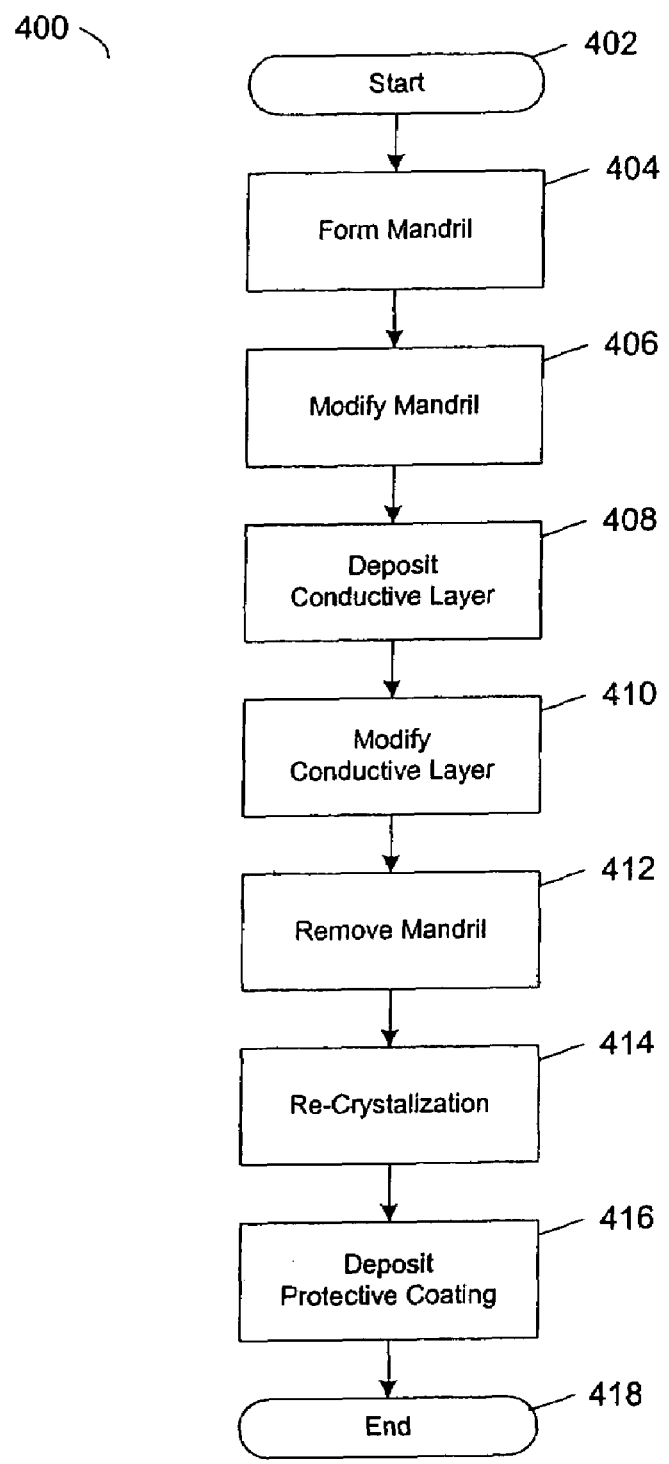
FIG. 10 illustrates one embodiment of a process flow for forming the air bridge electrical interconnect in FIGS. 8, 9 with enhanced electrical properties.

FIG. 10 illustrates one embodiment of a method 400 that maybe used to form the electrical interconnect or air bridge structure 330 as described in FIGS. 8, 9. The method 400 initiates in a start state 402 and proceeds to a state 404, wherein the mandril 104 or temporary support structure 356 may be formed on the upper surface 304 of the substrate 302 in a generally known manner as previously described in FIGS. 4, 9A–9H. The temporary support structure 356 may be placed between the first and second mounting regions 312, 322 so as to distally extend above the surface 304. In one aspect, the purpose of the temporary support structure 356 is to provide a supporting surface that substantially supports the laterally extending member 331 during formation of the air bridge structure 330. The temporary support structure 356 may be patterned, etched, and formed using various materials and various deposition techniques that are generally known in the art in a manner such that the temporary support structure 356 may be removed to expose a lower surface of the air bridge structure 330.

After forming temporary support structure 356 in the state 404, the method 400 advances to a state 406, wherein the temporary support structure 356 is modified, using conventional etching techniques, to form vias 352, 354 in the temporary support structure 356 that vertically extend from an upper surface of the temporary support structure 356 to the respective first and second mounting regions 312, 322. The correspond to the first and second vertically extending legs 334, 336. Also, in the state 406, the height of the temporary support structure 356 may be modified so as to comprise a reduced height 372 in a manner as described with reference to FIG. 9D. Advantageously, the reduced height 372 of the temporary support structure 356 allows the laterally extending member 331 of the air bridge structure 330 to be formed when the conductive layer 258 is deposited and planarized in a manner as described herein below.

Next, in a state 408, the method 400 proceeds to a state 410, wherein the conductive layer 258 is formed in an overlying manner on the temporary support structure 356 such that the conductive layer 258 horizontally extends across the upper surface of the temporary support structure 356 between the vias 352, 354. The deposition of conductive layer 258 is used to form the air bridge structure 330 including the laterally extending member 331 and the first and second vertically extending legs 334, 336. In one aspect, the conductive layer 358 vertically extends through the vias 352, 354 to form the first and second legs 334, 336 and contact the first and second mounting regions 312, 322 of the first and second circuit elements 310, 320. The conductive layer 258 preferably comprises a highly conductive material having a relatively small ratio of ($\rho$/E), such as copper or silver, thereby providing the air bridge structure 330 with a relatively small resistance and a reduced tendency to sag as previously mentioned above.

The method then advances to a state 410, wherein the conductive layer 258 is modified so as to define the shape of the air bridge structure 330. For example, the laterally extending member 331 of the air bridge structure 330 may be planarized using a conventional chemical mechanical planarization (CMP) process. As previously described, the CMP process is used to remove material across a surface in a substantially uniform manner. As is known in the art, the formation of substantially uniform surfaces are desirable for the subsequent deposition of additional layers with uniform thickness.

Next, the method 400 proceeds to a state 412, wherein the temporary support structure 356 is removed in a generally known manner so as to expose the lower surfaces of the air bridge structure 330. Once the temporary support structure 356 is removed in the state 412, the conductive layer 258 material of the air bridge structure 330 is allowed to re-crystallize in a state 414. According to the Applicant, some materials that may be used to form the air bridge structure 330 may re-crystallize at room temperature. For example, copper following a CMP process may re-crystallize at 200° C. In contrast, for example, a copper-tin (0.24%) alloy may require a heat treatment above 375° C. for re-crystallization.

In one aspect, a pre-determined time allotment may granted for the purpose of microstructure re-crystallization of the material used to form the air bridge structure 330. In another aspect, it may be desirable to utilize environmental control techniques to control microstructure re-crystallization. For example, the integrated circuit 300 including the air bridge structure 330 may be placed in an environment conducive to allowing desirable re-crystallization. The environment may comprise a vacuum, wherein contaminants and impurities are removed from the atmosphere. Other factors that may influence desirable re-crystallization may include temperature and pressure control, wherein various heat treatments and pressure treatments may be utilized to control microstructure re-crystallization. It should be appreciated that the air bridge structure 330 may comprise similar features including dimensions, shape, and functionality as described with reference to the bridge section 50 as reference by FIGS. 4–7.

After allowing microstructure re-crystallization in the state 414, the method 400 advances to a state 416, wherein disposing of a adherent coating on the exposed surfaces of the electrical interconnect may be performed. In one aspect, disposing the adherent coating may comprise depositing a layer of conductive material selected from the group comprising the noble metals gold, platinum, palladium, iridium, and the reactive elements titanium, zirconium and hafnium. Furthermore, the conductive material of the coating may be deposited using a known electroless plating process or a known CVD process. It should be appreciated that, for example, if one of the reactive elements is used, zirconium may be preferred due to its low solubility in both copper and silver.

In one embodiment, disposing the adherent coating may comprise depositing an insulating material. For example, the insulating material may comprise an organic material, such as parylene, which can be deposited using a known vapor deposition polymerization process. Alternatively, the insulating material can comprise an inorganic material, such as $Si_3N_4$, which can be deposited using PECVD. In one aspect, diffusion of the adherent coating may be inhibited by not exposing the air bridge structure 330 to elevated temperatures. Preferably, the adherent coating is deposited in a manner such that the material only deposits on the air bridge structure 330. It should be appreciated that the adherent coating may comprise similar features including dimensions, shape, and functionality as described with reference to the coating 62 as reference by FIGS. 4–7. It should also be appreciated that, after applying the adherent coating on the air bridge structure 330, a heat treatment may be used to improve adhesion along the grain boundaries 332 on the surfaces of the air bridge structure 330, which may further enhance the electromigration resistance of the air bridge structure 330. After depositing the adherent coating on the air bridge structure 330 in the state 416, the method 400 proceeds to terminate in an end state 418.

In one embodiment, mechanical stability of the air bridge structure 330 may be increased by back-filling the spaces or vacancies at least in part with an insulating material between the air bridge structure 330 and the substrate 302. In addition, a foamed polymer may be used in a manner as disclosed in the Applicant's issued patent entitled "Method of Forming Foamed Polymeric Material for an Integrated Circuit" (U.S. Pat. No. 6,077,792), which is hereby incorporated by reference in its entirety. The issued patent discloses a method of forming an insulating material, such as a polymetric material, for use in an integrated circuit, wherein at least a portion of the polymeric material is converted to a foamed polymeric material. The converting of the polymeric material includes exposing at least a portion of the polymeric material to a supercritical fluid. The integrated circuit may include a substrate of the integrated circuit and a foamed polymeric material on at least a portion of the substrate. The integrated circuit may further include a conductive layer adjacent the foamed polymeric material.

By allowing the microstructure of the electrical interconnect or air bridge structure 330 to re-crystallize in the state 414, the quantity of exposed grain boundaries may advantageously be reduced. A reduction in the quantity of exposed grain boundaries may lead to an improvement in the electrical properties, including enhanced electromigration resistance and enhanced diffusion resistance, of the electrical interconnect or air bridge structure 330. Enhanced electrical properties may improve the reliability of the electrical interconnect or air bridge structure 330 by improving the crystalline orientation and compositional integrity of the microstructure.

Although the preferred embodiment of the present invention has shown, described and pointed out the fundamental novel features of the invention as applied to this embodiment, it will be understood that various omissions, substitutions and changes in the form of the detail of the device illustrated may be made by those skilled in the art without departing from the spirit of the present invention. Consequently, the scope of the invention should not be limited to the foregoing description, but should be defined by the appending claims.

What is claimed is:

1. A method of forming an air bridge structure between a first and second circuit component on a substrate, the method comprising:
    forming a support structure on the substrate;
    forming vias in support structure above the first and second circuit components;
    depositing a conductive layer so as to form vertically extending legs in the vias and a laterally extending member between the upper portions of the vertically extending legs in a manner so as to form an air bridge structure that electrically interconnects the first and second circuit components, wherein forming the laterally extending member exposes grain boundaries adjacent the surface of the laterally extending member resulting in an increased resistivity through the air bridge structure;
    removing the support structure so as to suspend the laterally extending member above the substrate between the first and second circuit components via the vertically extending legs, wherein removing the support structure results in forming grain boundaries in the laterally extending member and the vertically extending legs, which increases resistivity through the air bridge structure; and
    processing the air bridge structure by coalescing the grain boundaries so as to form fewer grain boundaries, which results in a decreased resistivity through the air bridge structure.

2. The method of claim 1, wherein depositing the conductive layer includes depositing a material with a line resistivity of at least less than that of aluminum.

3. The method of claim 1, wherein depositing the conductive layer includes depositing a material with a ratio of mass density over modulus of elasticity $(E/\rho)$ that is at least greater than gold.

4. The method of claim 1, wherein processing the air bridge structure includes re-crystallizing the laterally extending member and the vertically extending legs in a manner so as to form fewer grain boundaries.

5. The method of claim 1, wherein coalescing the grain boundaries occurs at room temperature.

6. The method of claim 1, wherein coalescing the grain boundaries includes performing a heat treatment.

7. The method of claim 1, wherein coalescing the grain boundaries improves the electrical properties of the conductive layer.

8. The method claim 7, wherein improving the electrical properties of the conductive layer includes enhancing the electromigration resistance of the conductive layer.

9. The method claim 7, wherein improving the electrical properties of the conductive layer includes enhancing the diffusion resistance of the conductive layer.

10. The method of claim 1, wherein the method further comprises annealing the air bridge structure.

11. The method of claim 1, wherein forming the laterally extending member includes planarizing the conductive layer using a CMP process.

12. The method of claim 1, wherein forming a conductive layer comprises depositing a least one of copper, silver, and gold.

13. The method of claim 1, wherein the method further comprises forming an adherent coating on the air bridge structure.

14. The method of claim 13, wherein forming the adherent coating on the air bridge structure includes depositing at least one of gold, titanium, zirconium, hafnium, chromium, and vanadium on the air bridge structure.

15. A method of forming an electrical interconnect for an integrated circuit having a substrate with at least two semiconductor components, the method comprising:
    forming a bridge structure having a crystalline microstructure by laterally extending a first material between the at least two semiconductor components in a manner so as to suspend the first material in a gaseous medium above the substrate of the integrated circuit, wherein forming the first material produces grain boundaries in the crystalline microstructure;
    re-crystallizing the first material in a manner so as to form fewer grain boundaries in the crystalline microstructure, wherein forming fewer grain boundaries improves the electrical properties of the first material;
    insulating the first material with a second material so as to substantially reduce environmental degradation of the first material; and
    applying a heat treatment in a manner so as to strengthen the bond between the first and second material, wherein the heat treatment further improves the electrical properties of the first material.

16. The method of claim 15, wherein improving the electrical properties of the first material includes improving the electromigration resistance of the first material.

17. The method of claim 15, wherein the first material comprises a conductive material.

18. The method of claim 17, wherein the conductive material comprises high line resistivity.

19. The method of claim 15, wherein forming the bridge structure with the first material includes forming the bridge structure with silver.

20. The method of claim 15, wherein forming the bridge structure with the first material includes forming the bridge structure with copper.

21. The method of claim 15, wherein forming the bridge structure with the first material includes forming the bridge structure with gold.

22. The method of claim 15, wherein the second material comprises an insulating material.

23. The method of claim 15, wherein insulating the first material with the second material comprises applying an adherent coating to the first material using the second material.

24. The method of claim 23, wherein forming an adherent coating on the conductive layer includes depositing at least one of titanium, zirconium, hafnium, chromium, and vanadium on the conductive layer.

* * * * *